United States Patent [19]
Larnerd et al.
[11] 3,811,186
[45] May 21, 1974

[54] METHOD OF ALIGNING AND ATTACHING CIRCUIT DEVICES ON A SUBSTRATE

[75] Inventors: John D. Larnerd, Vestal; Donald M. McGarigle, Binghamton; Carl E. Samuelson, Johnson City, all of N.Y.

[73] Assignee: International Business Machines Corporation, Armonk, N.Y.

[22] Filed: Dec. 11, 1972

[21] Appl. No.: 314,056

[52] U.S. Cl. .................... 29/626, 29/577, 29/580, 174/68.5, 317/101 C, 317/101 CC, 339/17 B, 339/17 C

[51] Int. Cl. .................... H05k 3/30

[58] Field of Search .......... 29/626, 627, 423, 577, 29/589, 590, 591, 203 P, 580; 174/68.5; 339/17; 317/101 C, 101 CC

[56] References Cited

UNITED STATES PATENTS

| | | | |
|---|---|---|---|
| 3,290,756 | 12/1966 | Dreyer | 29/626 |
| 3,457,639 | 7/1969 | Weller | 29/578 |
| 3,521,128 | 7/1970 | Oates | 29/577 X |
| 3,098,287 | 7/1963 | Buchsbaum | 29/626 |
| 3,392,442 | 7/1968 | Napier et al. | 29/626 UX |
| 3,488,840 | 1/1970 | Hymes et al. | 29/589 X |

OTHER PUBLICATIONS

Clark & Klein, "Joining Integrated Circuit Chips to Microcast Fingers," IMB Tech. Disclosure Bull., Apr. 1970, p. 198 1–2, Vol. 12, No. 11.

Hamilton et al., "Thermal Stress Resistant Solder Reflow Chip Joints," IMB Tech. Discl. Bull., Vol. 14, No. 1, June 1971, pg. 257–258.

Ainslie et al., "Semiconductor Module Structure," IMB Tech. Disclosure Bulletin, Vol. 14, No. 1, June 1971, pg. 246.

*Primary Examiner*—Charles W. Lanham
*Assistant Examiner*—Joseph A. Walkowski
*Attorney, Agent, or Firm*—Kenneth P. Johnson

[57] ABSTRACT

Method for aligning and supporting micro-circuit devices on substrate conductors during attachment thereto in which shaped, flexible, insulative material is placed between the devices and their respective conductors to support heat fusible terminals of the devices in alignment with mating heat-fusible conductor lands during formation of the respective fused connections. The insulative material can be of selected thickness to support the non-attached terminals either in contact or out of contact with their mating lands. When the circuit devices are held out of contact with their lands, the supporting material, being of plastic character, softens during heating to allow contact during the joining of the fusible connections and, upon cooling, returns to a thicker state to elongate the fused connections.

14 Claims, 6 Drawing Figures

METHOD OF ALIGNING AND ATTACHING CIRCUIT DEVICES ON A SUBSTRATE

BACKGROUND OF THE INVENTION

The assembly of miniature circuit devices, such as monolithic circuit chips, thin-film devices or microelectronic circuit elements, is slow and expensive because their small size makes alignment and support during attachment extremely difficult. Although the devices can be properly oriented relative to an ultimate position, maintenance of the alignment requires miniature, highly accurate equipment having stability during heating cycles to reliably attach the devices.

Each circuit device usually has several depending terminals that are to be simultaneously soldered to conductor land areas on a supporting substrate having printed circuits thereon. These devices are frequently on the order of an eighth of an inch square with six to 10 terminals along an edge. Therefore, alignment must be held within close tolerances. These devices have been frequently held in alignment during attachment by either a miniature vacuum chuck or by a tacky material such as a solder flux. Frequently, vibration and misalignment occur when the fusible metal, usually solder, is in the molten state. Terminals can be either mismatched or produce short circuits between the two adjacent substrate circuit lines.

In order to overcome this problem, it has been proposed that the entire surface of the substrate be coated with a photosensitive material such as conventional photoresist which is then selectively exposed and developed to provide depressions at the chip sites. Into these cleared areas there are then placed the various electrical devices which closely fit the outlines of the recesses. In this manner, the devices are held in place during subsequent attachment of the device terminals.

This process, however, is not well suited for the placement and alignment of integrated circuit chips which have rough edges, having been broken along their edges from a larger disk cut by means such as a laser. In these instances the rough edges do not provide a reliable locating surface so that the miniature contacts cannot be held in proper alignment during the attachment. The edge variation of such chips is sufficiently great that the chips will not readily fit into the formed depression. If the depression is large enough to accept the chip variations then misalignment is permitted as to some chips.

Vacuum chucks have often been used in locating circuit chips during attachment to their land sites in order to remove the weight of the chip from the molten solder connection during attachment to attain relatively tall solder pillars. When the connecting fusible metal is relatively tall, there can be greater differences in the coefficient of expansion between the chip and its substrate without damaging the fused connections. It is, therefore, desirable to avoid relatively massive, short solder connections which do not have much resilience in the event relative movement occurs between the chip and its substrate.

It is accordingly a primary object of this invention to provide an improved alignment technique for mounting circuit chips on their attachment sites without relying on the edge contours to thereby obtain a greater degree of accuracy in aligning mating contacts.

A further object of this invention is to provide a method for aligning circuit chips with their attachment sites with improved accuracy without reliance on the edge contour of the chips and concurrently support the chips so that the weight of the chip does not cause cross-sectional enlargement of the fused connections between the chip and its mating circuit lands.

Another object of this invention is to provide an attachment method for circuit chips in which the chips are supported in alignment with their mating circuit lands by placing a readily formed removable support beneath the chip at the attachment site.

A still further object of this invention is to provide a method of supporting a circuit chip during attachment to its terminals with mating lands by supporting the chip on alignment material which has resilience such that it softens during the attachment process and then expands approximately to its original thickness during the cooling process to form elongated fused joints that provide improved resiliency between the substrate and chip proper.

SUMMARY OF THE INVENTION

The foregoing objects are attained in accordance with the present invention by providing a surface coating which is selectively placed on the surface of a substrate at the attachment sites for integrated circuit chips so as to form a support pedestal for the chip over the attachment site. The material is otherwise removed from the substrate surface. Supporting pedestals are so shaped as to leave circuit lands and mating depending chip terminals unobstructed so that fusible connections can be formed therebetween. The perimetral size and shape of the pedestals are such that the depending chip terminals engage the edge of the pedestal and are thus held in accurate registration with the mating lands.

The pedestal can be varied in height during formation so as to support the chip at correspondingly varying heights above the circuit lands. Pedestal material is preferably polymeric in nature and thus of plastic character which has the property of softening in the presence of moderate heating and yet is resilient enough to return to approximately its former thickness during cooling. The pedestal is made of sufficient height to support the cold chip out of contact with its mating circuit land. The pedestal softens sufficiently during heating such that, with the application of slight additional force from the accompanying heating means, the mating terminals and lands touch and join to accomplish fusing. Thereafter the pedestal returns to its approximate original thickness upon cooling and removal of the force, thus creating elongated pillar-like joints.

A modification of the invention provides a supporting wall which engages the underside of the chip, but on the outside edges of the depending terminals. In this instance, gas escape ports are provided in the supporting material to relieve pressure build-up beneath the chip during heating.

The invention has the advantage that conventional photoresist materials can be used for the aligning and supporting pedestals. Such materials can be varied in thickness and have the resiliency required during heating to allow connection and thereafter return to their original thickness. This material also permits easy, accurate and simple placement by using conventional mask exposure and development techniques to form the pedestals. The interior pedestal serves as a solder barrier on circuit lines passing thereunder and permits visual inspection of terminal and land alignment before attachment. Additionally, the pedestal aids in localizing heat at the solder joints and allow easy removal of the solder flux. The invention has the further advantage of allowing the pedestal to be easily removed with solvents after the circuit chips have been attached, if desired. With the disclosed method, no alignment of chip and lands is attempted with the rough chip edges so that improved accuracy is attainable, and chip conformance to the pedestal configuration is more easily assured by using the chip terminals as the locating surfaces.

The foregoing and other objects, features and advantages of the invention will be apparent from the following more particular description of preferred embodiments of the invention, as illustrated in the accompanying drawings.

DESCRIPTION OF PREFERRED EMBODIMENTS

Figures 1, 2, 3:
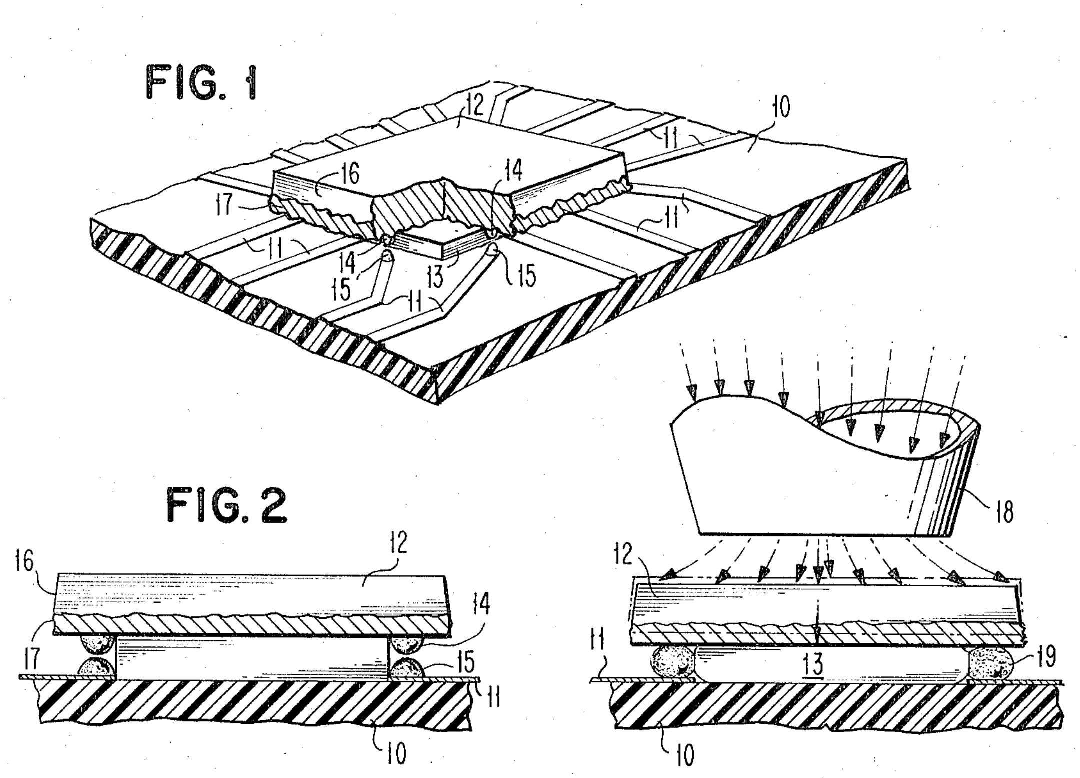
FIG. 1 is a perspective view of a portion of a circuit substrate with a circuit device supported thereover on a pedestal formed in accordance with the principles of the invention.
FIGS. 2–4 are cross-sectional views of a chip and its circuit substrate illustrating the sequential attachment steps of the chip and substrate when the supporting pedestal is heated to permit fused connections at its perimeter.

Referring to FIG. 1, there is shown a portion of a substrate 10 having printed circuits 11 thereon over which an integrated circuit chip 12 is positioned by a boss or pedestal 13. The pedestal aligns solder coated terminals 14 with mating circuit lands 15. Substrate 10 may be any conventional material such as ceramic, or epoxy-glass fiber material on which is formed electrically conductive lines 11, usually of copper. The radiating circuit lines can be variously arranged beneath chip 12 so as to provide circuit lands 15 to connect with the appropriate depending terminals 14 on the underside of the chip. In other words, lines 11 may cross underneath the chip from one side to the other, terminate at circuit lands 15, or interconnect with with other circuit lines beneath the chip.

The chip is usually formed from a larger wafer and is cut into the size shown by first scoring the wafer surface along sides 16 and then breaking the chip off from its neighbor along edge 17. This leaves a rough edge which can vary several mils in dimension. Circuit devices such as chip 12 can have a varying number of depending terminals 14, usually arranged in a triangle or quadrangle along the underside of the chip. They can be either plated or dipped in molten solder and their individual dimensions have been found to be quite uniform. The terminals can be varied in size according to the amount of area available for the formation of the terminals, but are generally 10 mils or less in diameter as are corresponding lands 15. It will, therefore, be appreciated that the alignment of mating terminals and lands requires accurate registration.

In order to provide for this registration, an accurately positioned alignment pedestal 13 is formed to fit within the area enclosed by the depending terminals 14 that protrude near the chip permimeter. The pedestal can be formed of various materials, but is preferably formed from a polymer which can be dissolved and removed subsequent to the solder reflow attachment. Materials particularly suitable for pedestals have been found to be commercially available photoresists, of which two examples are film type resists called "Laminar H.S." resist from Dynachem Corporation of Santa Fe Springs, California or "Riston" from the E. I. Du Pont de Nemours Company, Wilmington, Delaware.

The photoresist is applied, exposed, and developed in accordance with the manufacturer's instructions before attachment of chips, to form the pedestals precisely at the desired locations. Exposure is conventionally accomplished through a mask. With the usual negative type resist, the exposure produces a relatively insoluble polymer in the developing solution while the unexposed material can be more readily washed or removed by development solvents. As an example, the Dynachem film resist was laminated to a heated circuit panel at 80 PSIG, exposed with a 2,500 watt nuArc Plate Maker machine for approximately 60 seconds and subsequently developed for approximately 70 seconds in trichlorethylene to remove the unexposed material. The exposure time varies with the thickness of the photoresist coating.

Pedestal 13 is exposed to have a shape which will conform to the interior area delineated by terminals 14 and preferably abut the interior edges of the terminals to insure that the chip has little or no lateral movement on the pedestal when unattached. Experience had shown that the terminals 14 are accurately located in manufacture and more reliance can be placed on the terminal position than on the rough edges 17 at the periphery of the chip. Most resists are somewhat resilient and the chip can be pressed into place on the pedestal. If desired, the pedestal can be of sufficient size so that the wedging action will even permit the substrate to be inverted and still retain the chip in position. Photoresists tend to have a somewhat tacky surface which is effective to promote adherence of the chip over the attachment site.

The formation of an interior boss or pedestal 13 permits the alignment of mating terminals and lands to be visibly checked. It has also been found that the polymeric pedestals aid in localizing the heat necessary to fuse the solder globules at the joints.

Attachment of the chip to the circuit lands is accomplished in any of several ways such as by hot gas jet, resistance element, or oven. Photoresists, of course, become more insoluble and, hence, more difficult to remove when subjected to high temperatures for relatively long periods of time, such as in an oven.

The use of a supporting and aligning boss or pedestal for components and substrates offers the additional advantage of permitting construction of various heights. The pedestal 13 can be of minimal height wherein it merely prevents lateral displacement or it can be applied in a thicker layer and processed to provide a pedestal which supports the circuit device such that the depending terminals do not contact their mating lands.

Figure 4:
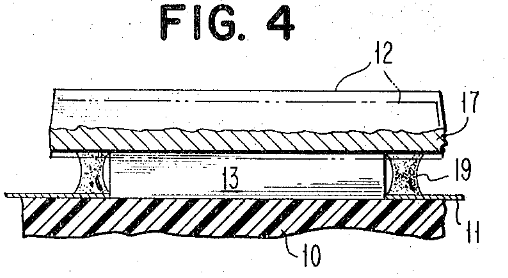

The latter configuration finds advantage in producing more uniform columnar solder joints at the mating lands and terminals. Referring to FIGS. 2, 3, and 4, there are illustrated the steps for producing the columnar joints between chip and substrate. In FIG. 2, pedestal 13 has been formed with a height sufficient to prevent contact between terminal and land solder globules 14 and 15. The solder on each contact is solidified. In FIG. 3, a hot gas nozzle 18 is brought into proximity with chip 12 to produce heating of the chip. The gas temperature is sufficient to melt the solder. As the chip is warmed by the gas stream, the pedestal beneath the chip also warms and softens. This allows the pressure of the impinging gas to compress the pedestal 13 to force solder globules 14 into contact with land globules 15. Because of this contact, the heat from the chip and its terminal globules is efficiently transferred to the globules on the lands. As chip 12 becomes warmer, its terminals become molten and further aid in transferring heat. When the contacting, mating globules become molten, they combine to produce a single molten globule of solder 19. As an example, compressed air at 80–90 PSIG was supplied to a rotometer which controlled air flow to a rate of 20 standard cubic feet per hour out of a 90 mil orifice. The air was heated by an electrical coil between the rotometer and orifice so that the exit temperature of the air was approximately 750°F. The gas nozzle was held at approximately 100 mils above the chip surface. This pressure has been found sufficient to bring the chip terminals into contact with their respective lands to allow joining when there was an original spacing of 3 to 4 mils.

In FIG. 4, upon removal of the external pressure of the heating nozzle or element, the chip, pedestal, and molten solder columns begin to cool. As the pedestal cools, it returns to its approximate original height before solidification of the solder thus forcing the chip forward. Because of the surface tension inherent in the molten solder, the joints are drawn into a columnar configuration in which the fused joints are elongated from their original molten state. Such joints are able to withstand greater bending moment in the event of relative movement between the chip and substrate due to expansion or contraction.

The photoresist can be originally applied as a plurality of coats or layers or laminated to itself to produce various thicknesses and thus control the heights of the formed pedestals. The photoresist forming the pedestal is preferably made of an original thickness that will require added force of the nozzle gas or other external pressure in order to produce the contact between mating terminals and lands.

Figure 5:
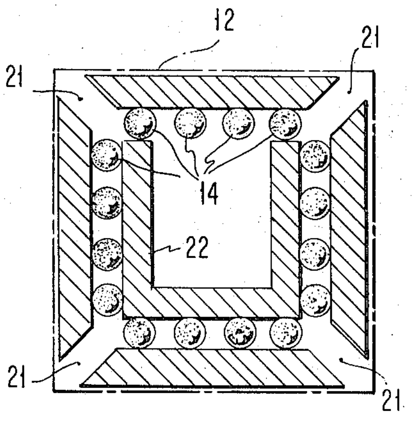
FIG. 5 is a cross-sectional view of a modification of the supporting pedestal shown in FIG. 1 in which the supporting pedestal is formed to engage the outer surfaces of the chip terminals during attachment.

In FIG. 5, there is shown a modification of the supporting arrangement described above in which the supporting pedestal 20 is shaped to conform to the circuit chip, shown in dotted line, along the underside of the chip outside depending terminals 14. The supporting pedestal is formed in the same manner and of the same material as described in the foregoing embodiment, with the exception of the formation of vents 21, preferably at each corner of the chip. It has been found that the vents are necessary to allow escape of heated gas beneath the chip during the attachment step. The gas formed is usually flux vapors. As will be noted, use in again made of the edges of the depending terminals as accurate reference surfaces for alignment. A solder stop 22 may optionally be formed to prevent solder wicking along circuit lines beneath the chip. This can be of any desired configuration and at the necessary locations.

When boss 13 is formed of photoresist selectively exposed through a mask, it can conveniently be formed with various configurations such as, for example, with extensions between adjacent terminals 14. This configuration is effective to maintain alignment when the terminal arrangement is not operable to restrain the chip in the several degrees of freedom. In some arrangements it may be permissible to leave the boss or pedestal material in place after attachment of the chip. If the photoresist is to be removed, a solvent of methylene chloride/methanol is frequently used.

Figure 6:
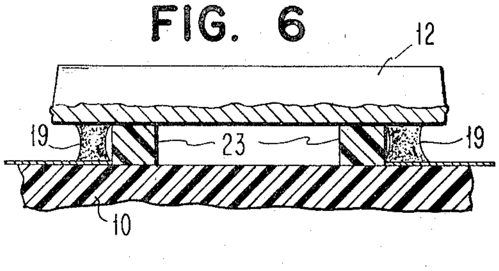
FIG. 6 is a cross-sectional view of another modification of the invention in which a plurality of smaller pedestals may be used to provide support or alignment for the circuit chip.

It will be noted in FIG. 6 that the restraining boss 13 need not be a single element but may comprise a plurality of strategically placed smaller bosses or pedestals 23. These bosses need only abut terminals 14 along one side of each small boss, so that fewer terminals need be engaged. This arrangement reduces the force required to depress the circuit device during heating to produce contact. Other special configurations for boss 13 can, of course, be readily devised to maintain alignment as required according to the terminal and land arrangement.

While the invention has been particularly shown and described with reference to preferred embodiments thereof, it will be understood by those skilled in the art that the foregoing and other changes in form and details may be made therein without departing from the spirit and scope of the invention.

We claim:

1. A method for joining a circuit device having heat-fusible terminals projecting from a common surface thereon with mating heat-fusible lands on a substrate comprising the steps of:

forming insulative material in relief on said substrate so that its edges engage a plurality of said terminals of a said circuit device positioned thereon to maintain lateral alignment between said terminals and their said mating lands;

placing said device over said material with each of said terminals aligned with its said mating land; and heating said aligned terminals and lands to produce fusing therebetween.

2. The method as described in claim 1, further including the step of removing said material from between said device and said substrate subsequent to the fusing of said aligned terminals and lands.

3. The method as described in claim 1, wherein the material shaped by said forming step is of a height sufficient to support said terminals in spaced, non-contacting alignment with their respective mating lands.

4. The method according to claim 1 wherein said material is a resilient polymer material which becomes more easily compressible upon heating.

5. The method as described in claim 4 wherein said heating is accompanied by the application of a pressure on said device sufficient to compress said material and allow contact between mating ones of said terminals and lands.

6. The method as described in claim 4 wherein said heating is accomplished by directing a stream of pressurized heated gas against said device to heat and soften said material and said fusible terminals and lands, while forcing said device toward said substrate to bring said terminals and lands into abutting relationship.

7. The method as described in claim 1 wherein said material is formed in relief on said substrate to occupy the included area defined by three or more of said terminals.

8. The method as described in claim 5 wherein said heating is accomplished by the application of an electrical resistance element to said device opposite said material to thereby compress said material and heat said terminals and lands to a fusible condition.

9. The method as described in claim 1 wherein said material is an electrically insulative material.

10. The method as described in claim 9 wherein said insulative material is a photoresist.

11. The method as described in claim 10 wherein said insulative material is formed by the utilization of photographic procedures.

12. The method as described in claim 1 wherein said material is formed to extend between and engage at least two of said terminals so as to prevent relative movement of said device longitudinally along a line between said two terminals.

13. The method as described in claim 1 wherein said material formed in relief is located so as to surround said terminals and lands.

14. A method for joining a circuit device having heat-fusible terminals projecting from a common surface thereon with mating heat-fusible lands on a substrate comprising the steps of:

securing insulative material to the surface of said substrate;

forming said material in relief on said substrate so that its edges engage a plurality of said terminals of a said circuit device positioned thereon to maintain lateral alignment between said terminals and mating lands;

placing said device over said material with each of said terminals aligned with its said mating land; and heating said aligned terminals and lands to produce fusing therebetween.

* * * * *